United States Patent
Gong et al.

(10) Patent No.: US 9,437,550 B2
(45) Date of Patent: Sep. 6, 2016

(54) TSV WITHOUT ZERO ALIGNMENT MARKS

(71) Applicant: GLOBALFOUNDRIES Singapore Pte. Ltd., Singapore (SG)

(72) Inventors: Shunqiang Gong, Singapore (SG); Juan Boon Tan, Singapore (SG); Wei Liu, Singapore (SG); Hai Cong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 332 days.

(21) Appl. No.: 14/106,870

(22) Filed: Dec. 16, 2013

(65) Prior Publication Data

US 2015/0170994 A1 Jun. 18, 2015

(51) Int. Cl.
*H01L 21/4763* (2006.01)
*H01L 23/544* (2006.01)
*H01L 21/768* (2006.01)

(52) U.S. Cl.
CPC ....... *H01L 23/544* (2013.01); *H01L 21/76816* (2013.01); *H01L 21/76898* (2013.01); *H01L 2223/5446* (2013.01); *H01L 2223/54426* (2013.01); *H01L 2924/0002* (2013.01)

(58) Field of Classification Search
CPC .................................................. H01L 21/4763
See application file for complete search history.

(56) References Cited

U.S. PATENT DOCUMENTS

2014/0147984 A1* 5/2014 Zhang ............... H01L 21/76898
438/401
2015/0076694 A1* 3/2015 Kuo ...................... H01L 23/147
257/751

* cited by examiner

*Primary Examiner* — Marvin Payen
(74) *Attorney, Agent, or Firm* — Horizon IP Pte. Ltd.

(57) ABSTRACT

Semiconductor device and method of forming a semiconductor device are disclosed. The method includes providing a substrate. A dielectric layer is formed on the substrate. The dielectric layer includes an upper and lower level. The upper level of the dielectric layer is patterned to form at least first and second trench openings and alignment mark openings. One of the first and second trench openings serve as a through via (TV) trench while another trench opening serves as an interconnect trench. A TV opening aligned to the TV trench is formed. The TV opening extends partially into the substrate. A conductive layer is formed over the substrate to fill the trenches and the openings.

20 Claims, 9 Drawing Sheets

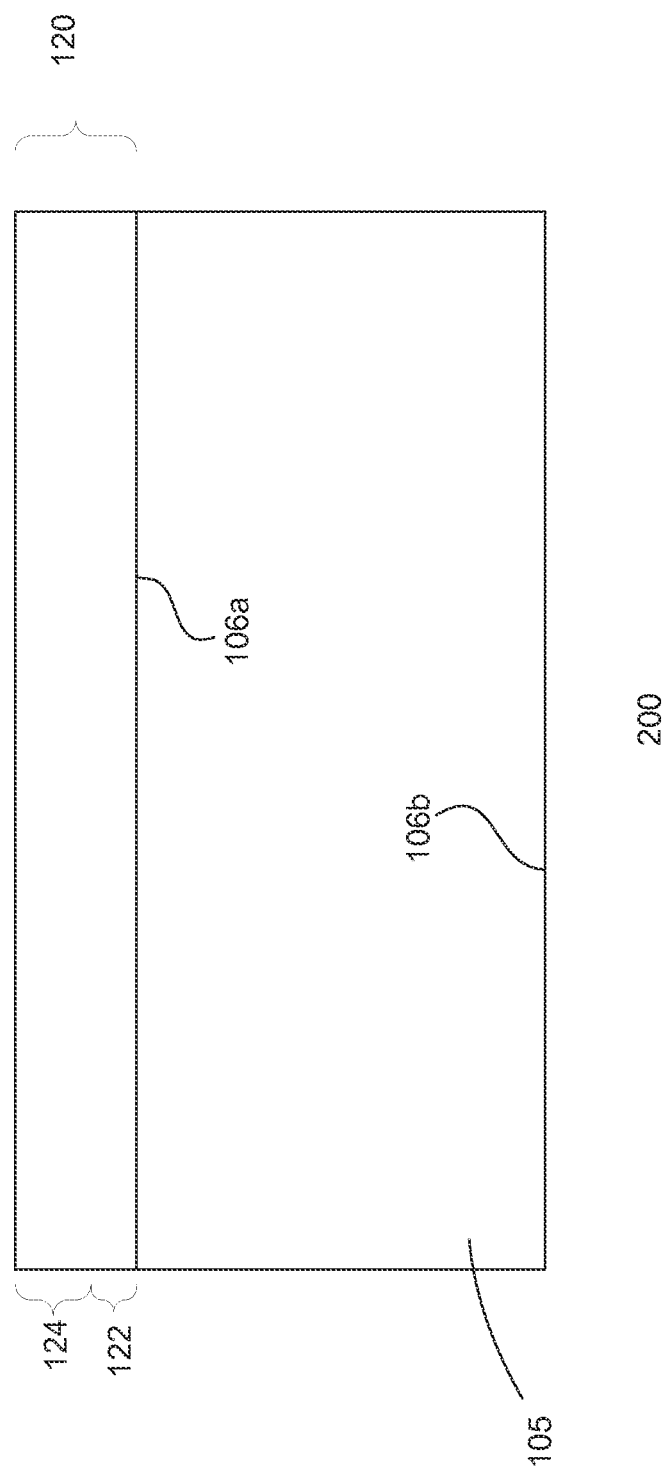

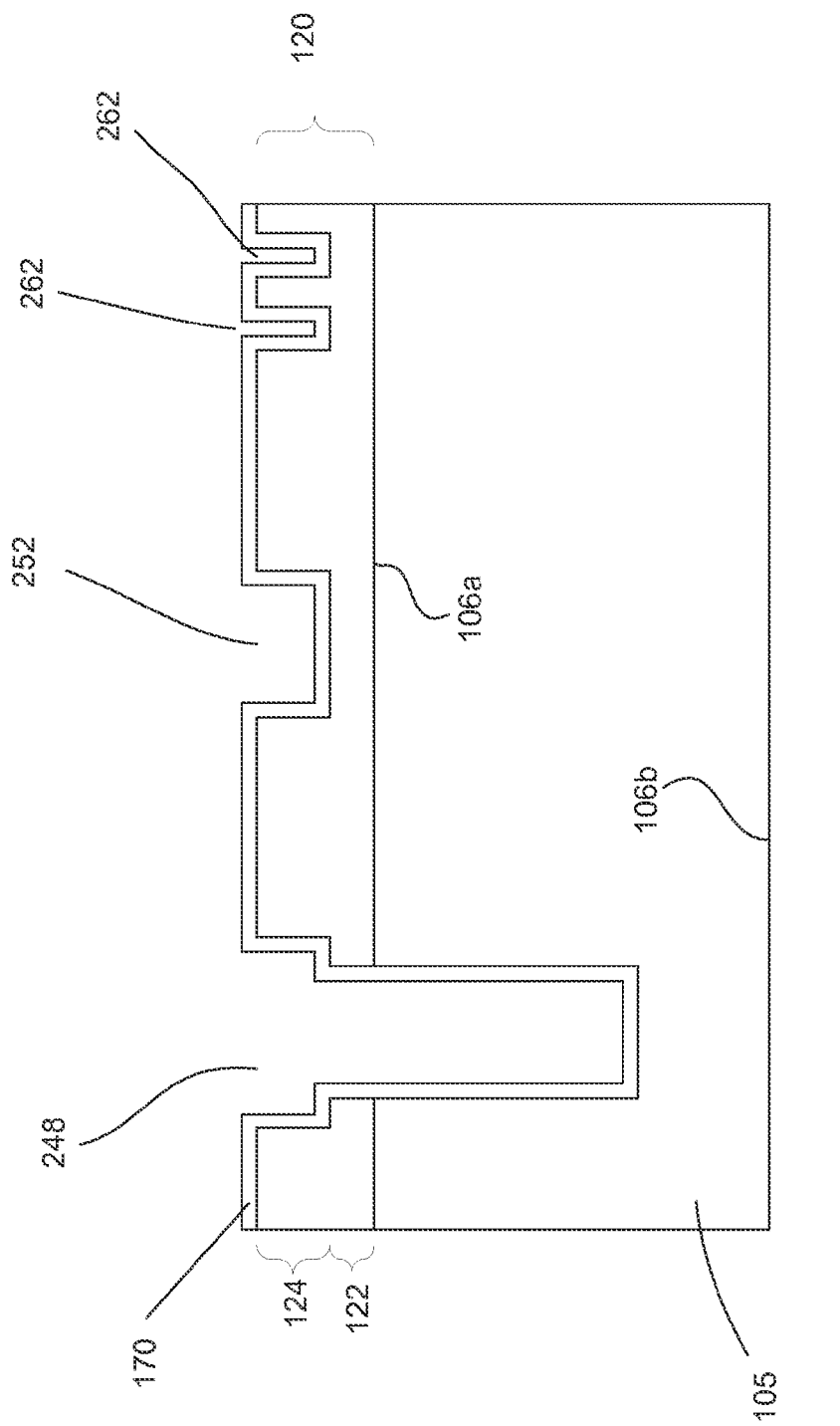

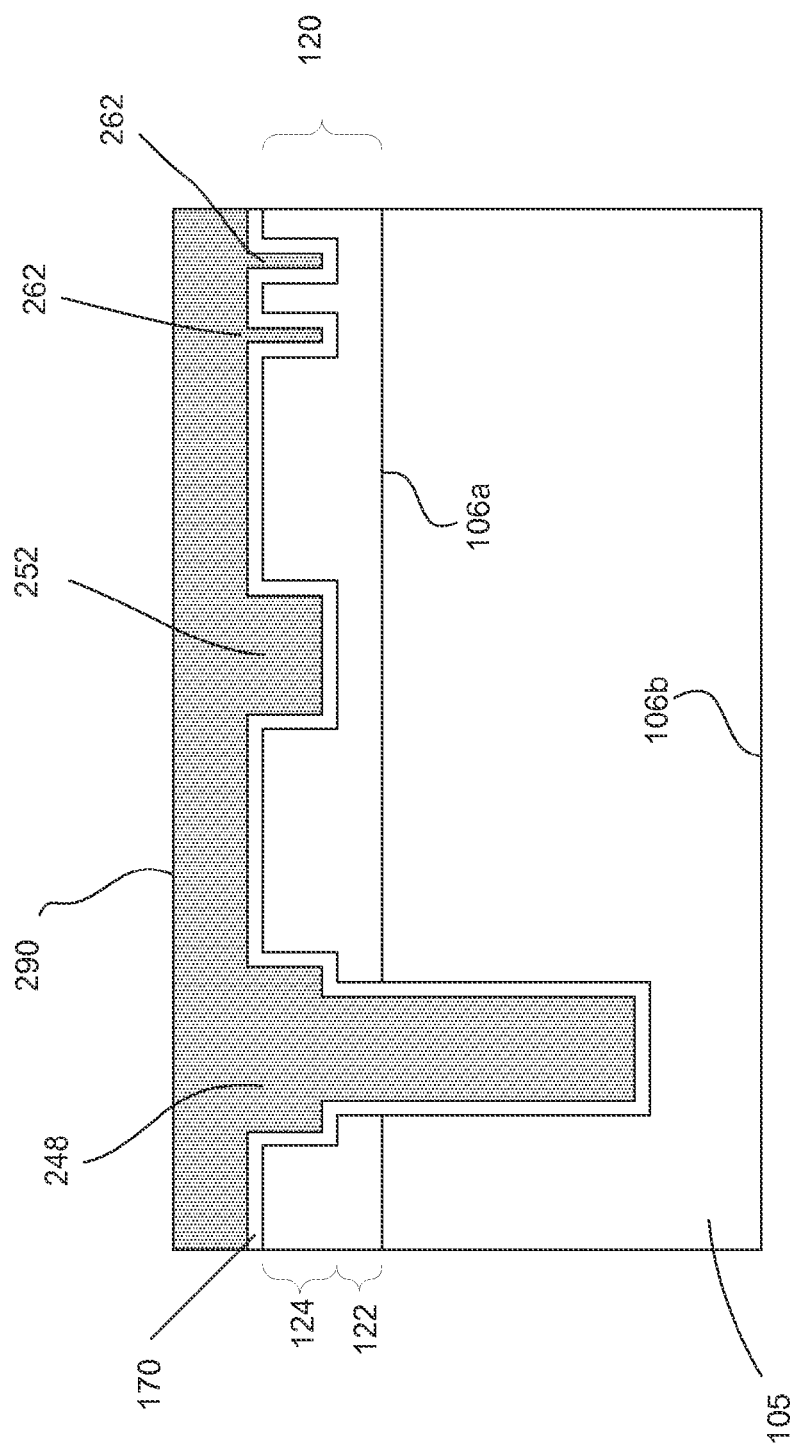

TSV WITHOUT ZERO ALIGNMENT MARKS

BACKGROUND

Through vertical interconnect access (via) is a vertical electrical connection passing completely through a silicon wafer or die. Through-silicon via (TSV) demonstrates a high performance technique used to create smaller packages and integrated circuits. This technique improves physical scaling limitations while delivering greater performance and functionality. However, further simplification of its manufacturing process will be beneficial in reducing manufacturing costs.

From the foregoing discussion, it is desirable to provide simplified, cost efficient and improved methods for forming TSVs.

SUMMARY

Embodiments generally relate to semiconductor device and method of forming a semiconductor device. In one embodiment, a method for forming a device is disclosed. The method includes providing a substrate. A dielectric layer is formed on the substrate. The dielectric layer includes an upper and lower level. The upper level of the dielectric layer is patterned to form at least first and second trench openings and alignment mark openings. One of the first and second trench openings serve as a through via (TV) trench while another trench opening serves as an interconnect trench. A TV opening aligned to the TV trench is formed. The TV opening extends partially into the substrate. A conductive layer is formed over the substrate to fill the trenches and the openings.

In another embodiment, a method of forming a device is presented. The method includes providing a substrate and forming a dielectric layer on the substrate. The dielectric layer includes an upper and lower level. The upper level of the dielectric layer is patterned to form at least first and second trench openings and alignment mark openings. One of the first and second trench openings serves as a through via (TV) trench. A TV opening aligned to the TV trench is formed. The TV opening extends partially into the substrate. A conductive layer is formed over the substrate to fill the trenches and the openings.

In yet another embodiment, a device is disclosed. The device includes a substrate. The substrate includes a surface which is devoid of zero alignment marks. A dielectric layer is disposed on the substrate. The dielectric layer includes an upper and lower level. The upper level of the dielectric layer includes first and second trench openings and alignment mark openings, where one of the first and second trench openings serves as a through via (TV) trench, and a TV opening aligned to the TV trench, where the TV opening extends partially into the substrate. The device includes a conductive layer which fills the trenches and the openings.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2h show an embodiment of a process of forming a device.

DETAILED DESCRIPTION

Embodiments generally relate to devices, such as semiconductor devices or ICs. Other types of devices may also be useful. In one embodiment, the device is an interposer for ICs. The interposer may be used by one or more ICs. For example, the interposer may facilitate forming system-on-chip (SoC) devices. The devices can be incorporated into, for example, consumer electronic products, such as computers, cell phones, and personal digital assistants (PDAs). Incorporating the devices in other applications may also be useful.

Figure 1:
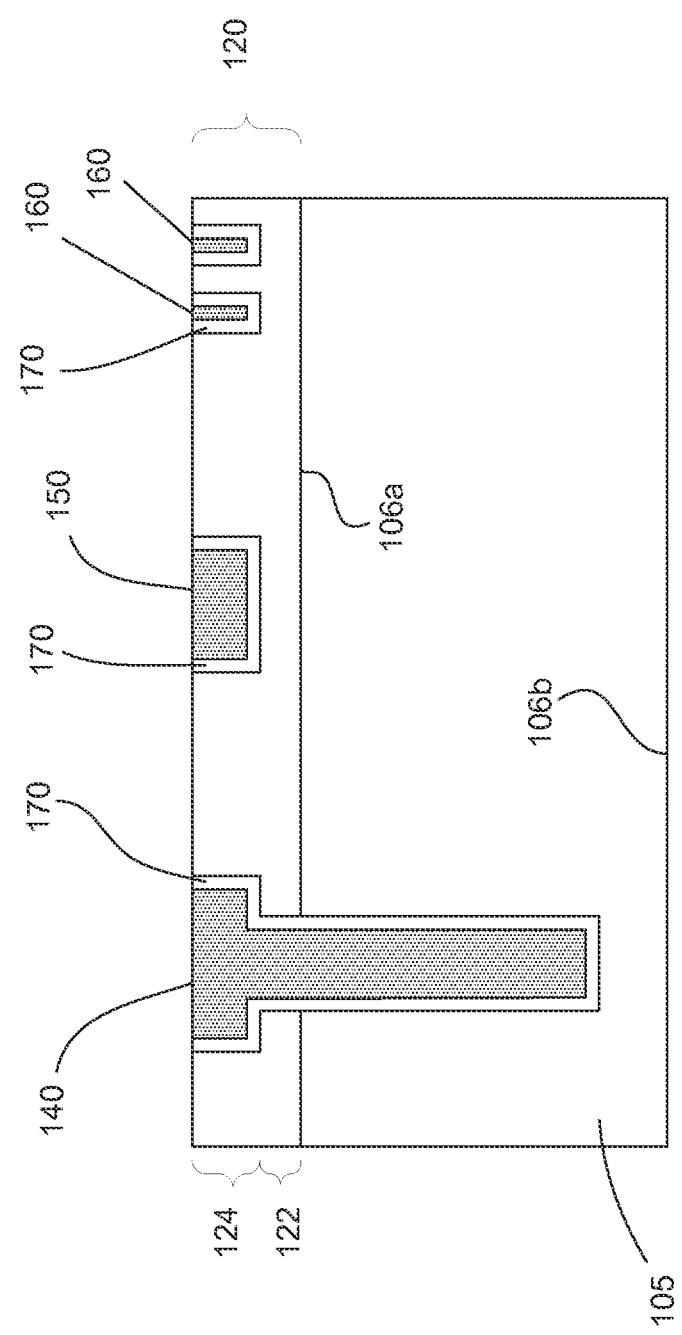
FIG. 1 shows a simplified cross-sectional view of an embodiment of a portion of a device.

FIG. 1 shows a simplified cross-sectional view of an embodiment of a portion of a device 100. The portion of the device shown is a partially processed device. The device includes a substrate 105. The substrate is a semiconductor substrate. For example, the substrate is a silicon substrate. Other types of substrates, such as glass or silicon germanium, are also useful. The substrate may be wafer. For example, a plurality of devices are formed on the wafer in parallel. After the wafer has finished processing, it is diced to singulate the devices.

The substrate includes first and second opposing major surfaces 106a-106b. The first major surface may be referred to as the top surface and the second surface may be referred to as the bottom surface. Other designations may also be useful. In one embodiment, the device is an interposer. For example, a plurality of interposers are formed in parallel on the wafer. The wafer is then diced after processing has been completed to singulate the interposers.

A dielectric layer 120 is disposed on the first substrate surface. The dielectric layer, for example, is a silicon oxide layer. Other types of dielectric materials may also be useful. The dielectric layer, for example, serves as an intermetal dielectric (IMD) layer. An IMD layer includes a trench level 124 in an upper portion which corresponds to a metal level (M). In one embodiment, the trench level serves as the first metal level M1. A lower level 122 is disposed in a lower portion of the IMD layer. The lower level separates the metal level from the substrate. The lower level may be referred to as a premetal dielectric (PMD) level.

In one embodiment, the first metal level includes an interconnect 150 and alignment marks 160. As shown, a through via (TV) contact 140 is provided. The TV contact may be a through silicon via (TSV) contact. Other types of TV contacts may also be useful. The TV contact is disposed in the IMD layer and extends partially into the substrate but not passing therethrough. The depth of the contact should be greater than the final thickness of the substrate. For example, when the substrate is thinned to its final thickness, a bottom surface of the TV contact is exposed. As shown, the TV contact includes an upper portion in the trench level and a lower portion in the PMD level of the IMD layer. Although the portion illustrates one TV contact and one interconnect, it is understood that the substrate may include a plurality of TV contacts and interconnects.

The TV contact, interconnect and alignment marks include a conductive material (shaded portion). The conductive material, for example, is copper. Other types of conductive materials may also be useful. In one embodiment, the liner 170 lines the TV contact, interconnect and alignment marks. The TV liner may include multiple layers. In one embodiment, the liner includes an isolation material, such as silicon oxide. A seed layer (not shown), such as a copper seed layer, may be disposed over the liner. Other suitable types of isolation material for the liner and other suitable types of materials for the seed layer may also be useful. The TV liner may have other suitable configurations. The top surface of the IMD layer and conductive material, including the liner, are coplanar.

In accordance with one embodiment, no alignment marks are provided on the substrate. For example, the device does not include any zero alignment marks on the substrate surface. Conventional TV contacts require a zero alignment mark on the substrate. This adds to additional processing to form the zero alignment marks, thereby increasing cost as well as decreasing throughput.

As discussed, the device or interposer is at an intermediate stage of processing. For example, the interposer may include additional metal levels above M1. For example, the interposer may include n metal levels, when M1 is the lowest and Mn is the highest. A via level Vx is disposed about the $x^{th}$ metal level. For example, a via level V1 is disposed above M1. The metal levels form an upper redistribution layer (RDL) of the interposer. The additional IMD levels may be formed using dual damascene techniques. For example, Mx and Vx-1 form dual damascene structures which are filled in one fill process. Other techniques may also be useful. Above Mn are interposer pads for connection to one or more ICs. Additionally, a lower RDL is disposed on the bottom substrate surface with exposed TV contacts. The lower RDL includes conductive traces connected to the TV contacts. Interposer contacts, such as contact bumps are connected to the traces, providing connection to the interposer pads through the TV contacts and upper RDL.

Figure 2B:
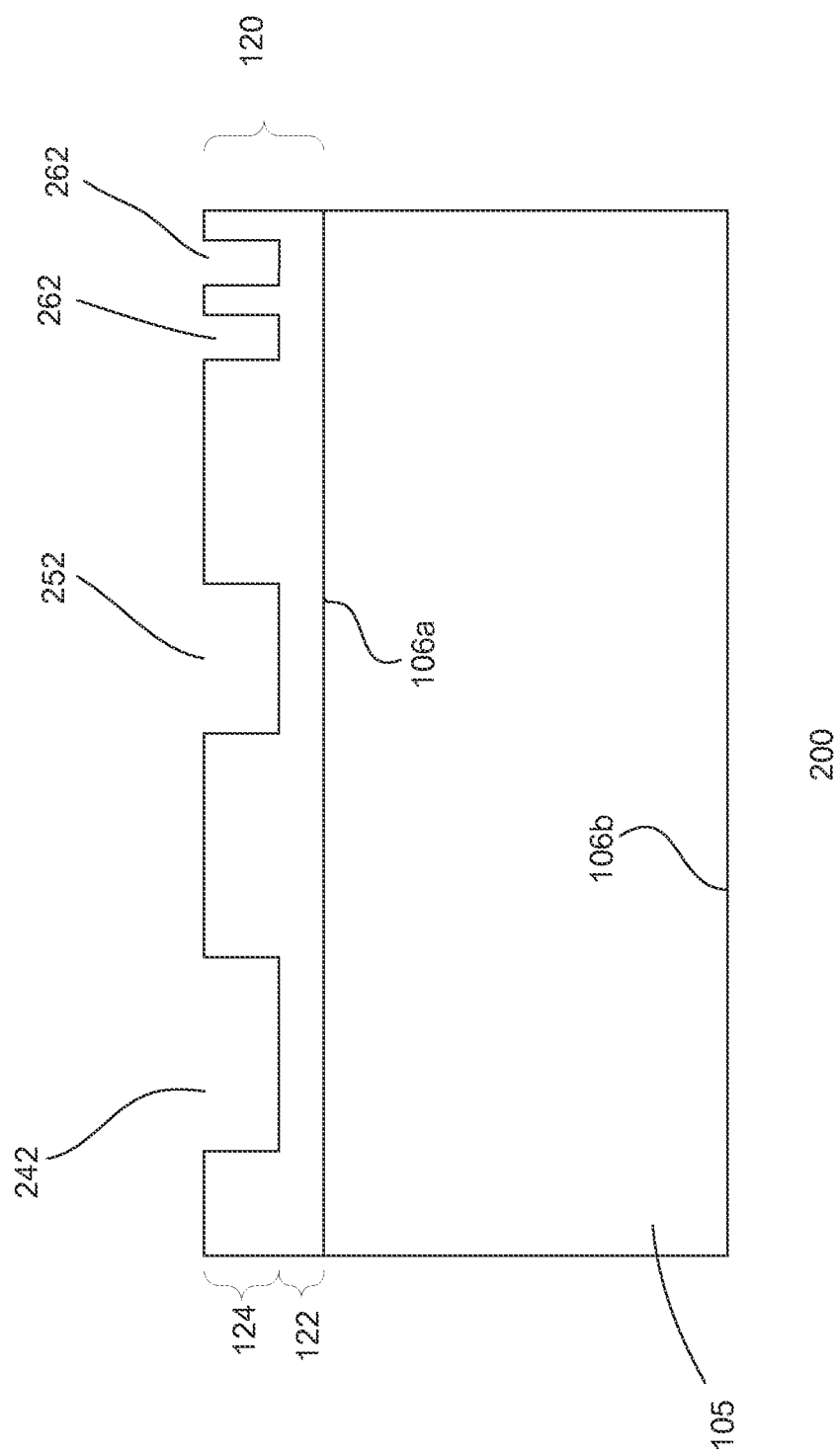

FIGS. 2a-2h show an embodiment of a process 200 for forming a device. The device formed is similar to that described in FIG. 1. Common elements may not be described or described in detail. As shown in FIG. 2a, a substrate 105 is provided. The substrate is a semiconductor substrate. For example, the substrate is a silicon substrate. Other types of substrates, such as glass or silicon germanium, are also useful. The substrate includes first and second opposing major surfaces 106a-106b. The first major surface may be referred to as the top surface and the second surface may be referred to as the bottom surface. Other designations may also be useful. In one embodiment, the device is an interposer.

A dielectric layer 120 is formed on the first substrate surface. The dielectric layer, for example, is a silicon oxide layer. Other types of dielectric materials may also be useful. Various techniques, such as chemical vapor deposition (CVD) may be used to form the dielectric layer. Other deposition techniques may also be useful. The dielectric layer, for example, serves as an intermetal dielectric (IMD) layer. An IMD layer includes a trench level 124 in an upper portion which corresponds to a metal level (M). In one embodiment, the trench level serves as the first metal level M1. A lower level 122 is disposed in a lower portion of the IMD layer. The lower level separates the metal level from the substrate. The lower level may be referred to as a premetal dielectric (PMD) level.

The process continues by patterning the trench level of the dielectric layer, as shown in FIG. 2b. In one embodiment, the trench level is patterned to form a TV trench 242, interconnect trench 252 and alignment mark openings 262. Mask and etch techniques can be employed to pattern the dielectric layer. For example, a soft mask (not shown) such as a photoresist and/or hard mask (not shown) may be formed over the dielectric layer and patterned to form openings correspond to the TV and interconnect trenches and alignment mark openings. The patterned soft mask and/or hard mask is used as an etch mask to pattern the dielectric layer. After patterning the dielectric layer, the mask (not shown) is removed. Removal can be achieved by, for example, ashing. Other suitable techniques to remove the mask may also be useful.

Figure 2C:
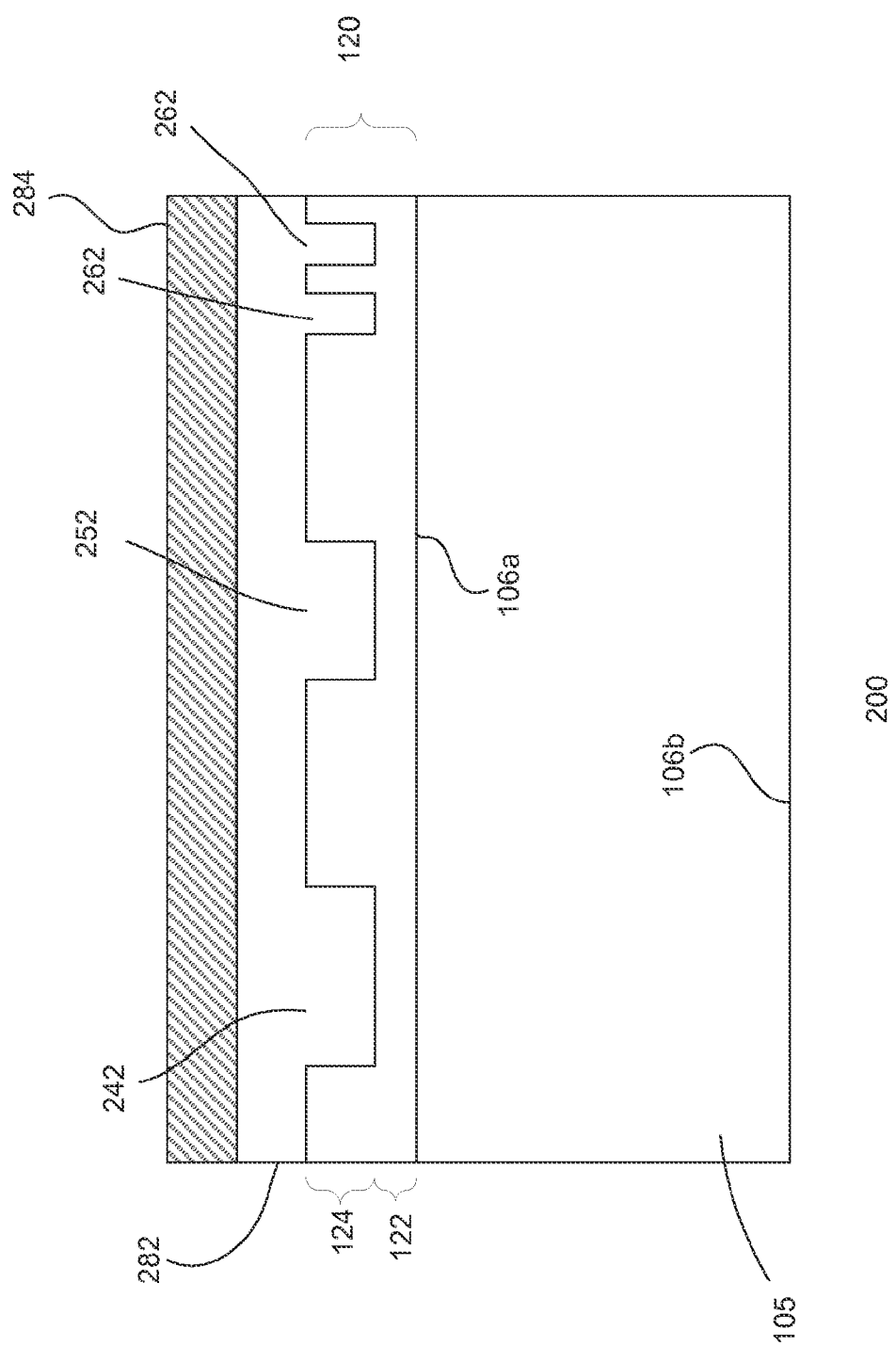

Referring to FIG. 2c, an anti-reflective coating (ARC) layer 282 is formed on the substrate. The ARC fills the openings in the dielectric layer. In one embodiment, the ARC is a bottom ARC (BARC). Other suitable types of materials with superior planarizing and gap fill characteristic may also be useful. The ARC layer is a self-planarizing layer. For example, a spin-on technique may be used to deposit the ARC on the substrate. The ARC fills the openings in the dielectric layer and forms a planar top surface. A soft mask layer 284 is formed on the ARC layer. The soft mask, for example, is a photoresist. The mask layer may be deposited by spin-on techniques.

Figure 2D:
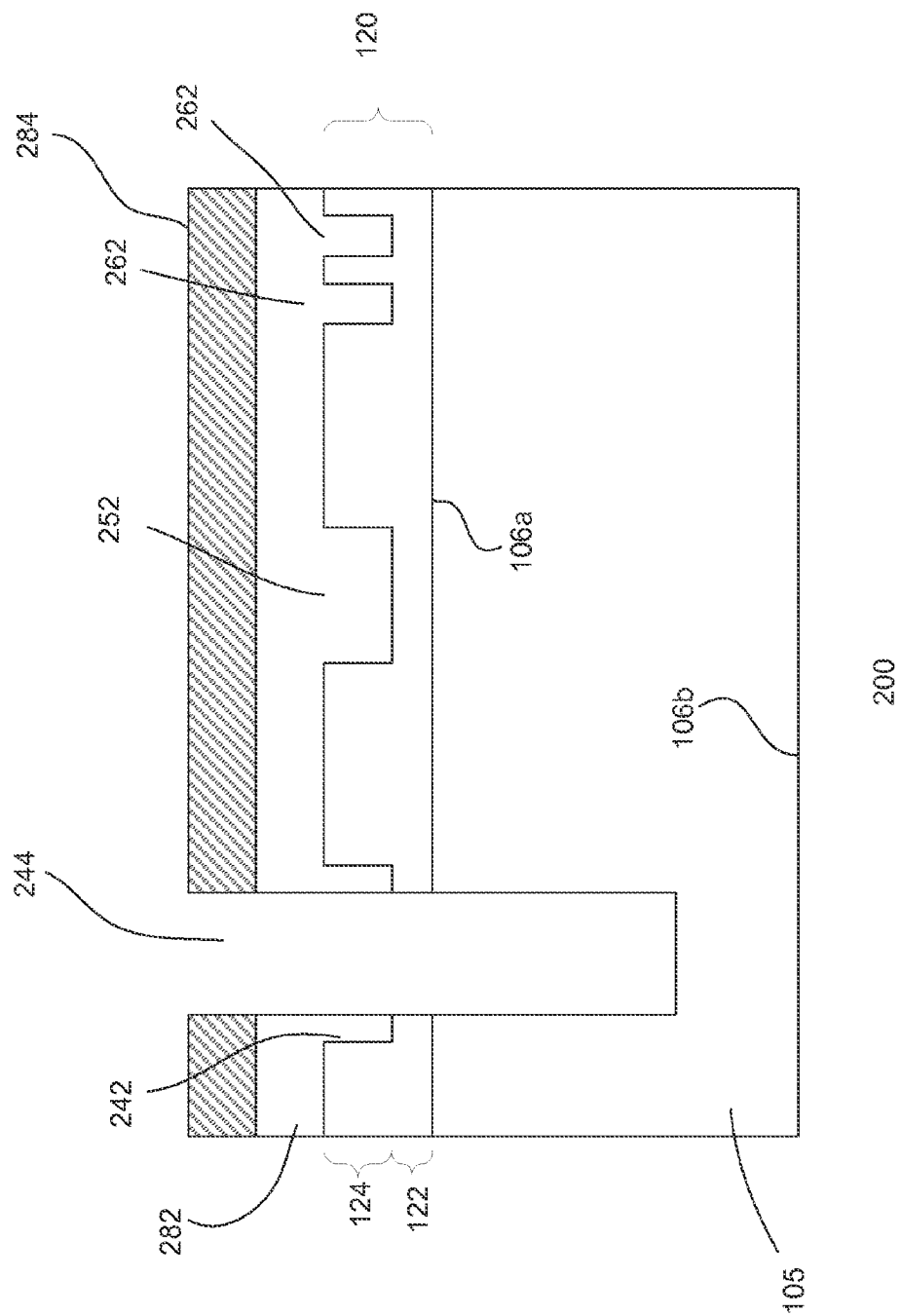
Figure 2E:
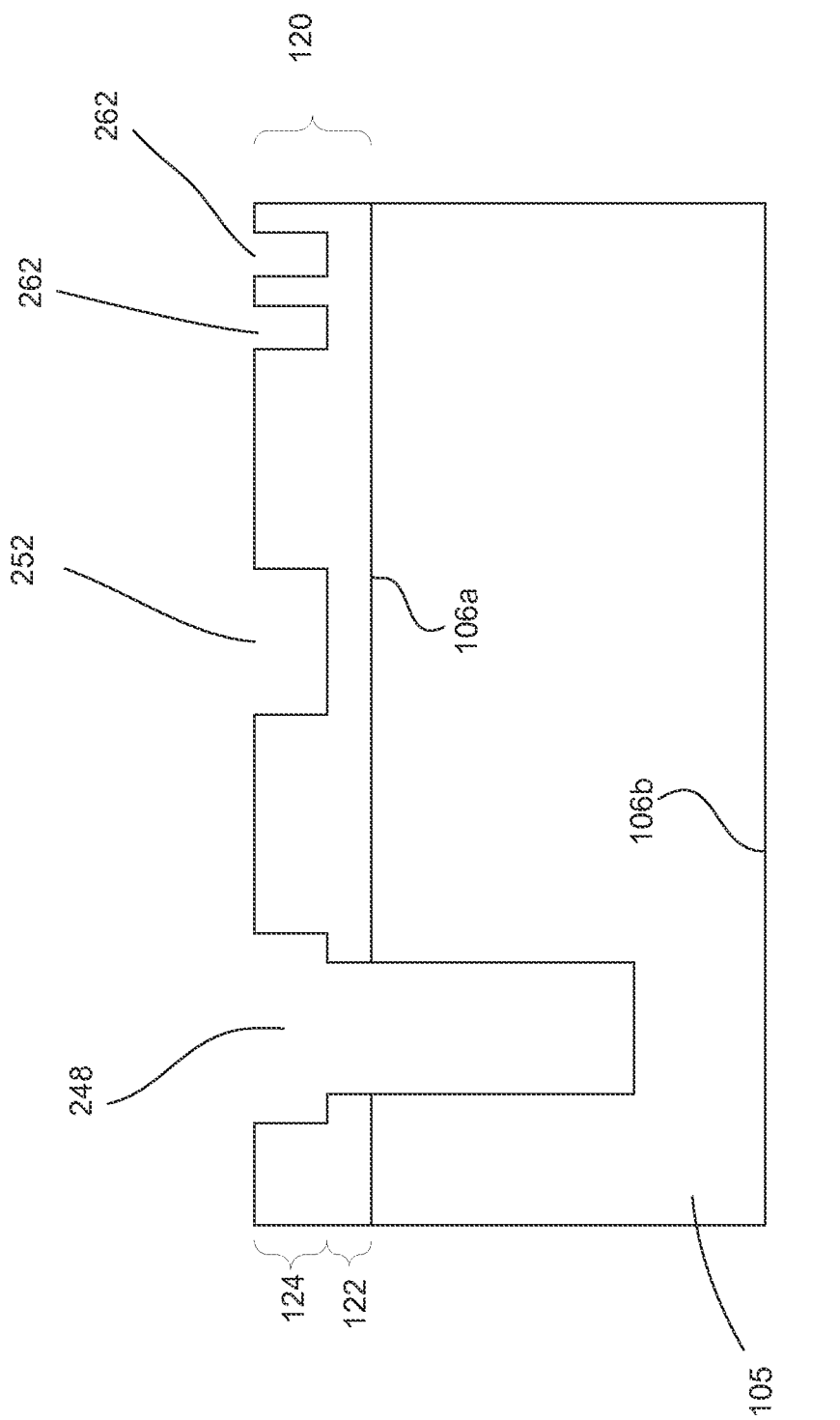

The soft mask, in FIG. 2d, is patterned to form an opening corresponding to a TV opening 244. The alignment mark openings 262, for example, may serve as scribed lanes as well as alignment marks to align the TV opening 244 with the TV trench 242. Reactive ion etch (RIE) process, for example, may be performed to pattern the ARC, dielectric layer and substrate to form the TV opening 244. The TV opening 244, for example, extends partially into the substrate as shown. After forming the initial TV opening, the mask 284 and ARC 282 are removed, as shown in FIG. 2e. The mask 284 and the ARC 282 are removed by wet etch and an ashing process. Other suitable techniques may be used to remove the mask 284 and the ARC 282. The removal of the mask and ARC exposes the TV trench and opening corresponding to a TV contact opening 248, interconnect trench 252 and the alignment mark openings 262.

Referring to FIG. 2f, a liner layer 170 is deposited on the substrate. The liner lines the TV contact opening, interconnect trench and alignment mark openings. In one embodiment, the liner is a liner stack. The liner stack includes a dielectric liner, such as silicon oxide. The dielectric liner lines the openings, including the substrate walls. The dielectric liner may be formed by CVD. A seed layer, such as a copper seed layer is formed over the dielectric liner. The seed layer may be formed by, for example, sputtering. Other techniques for forming the liner layers may also be useful.

Figure 2H:
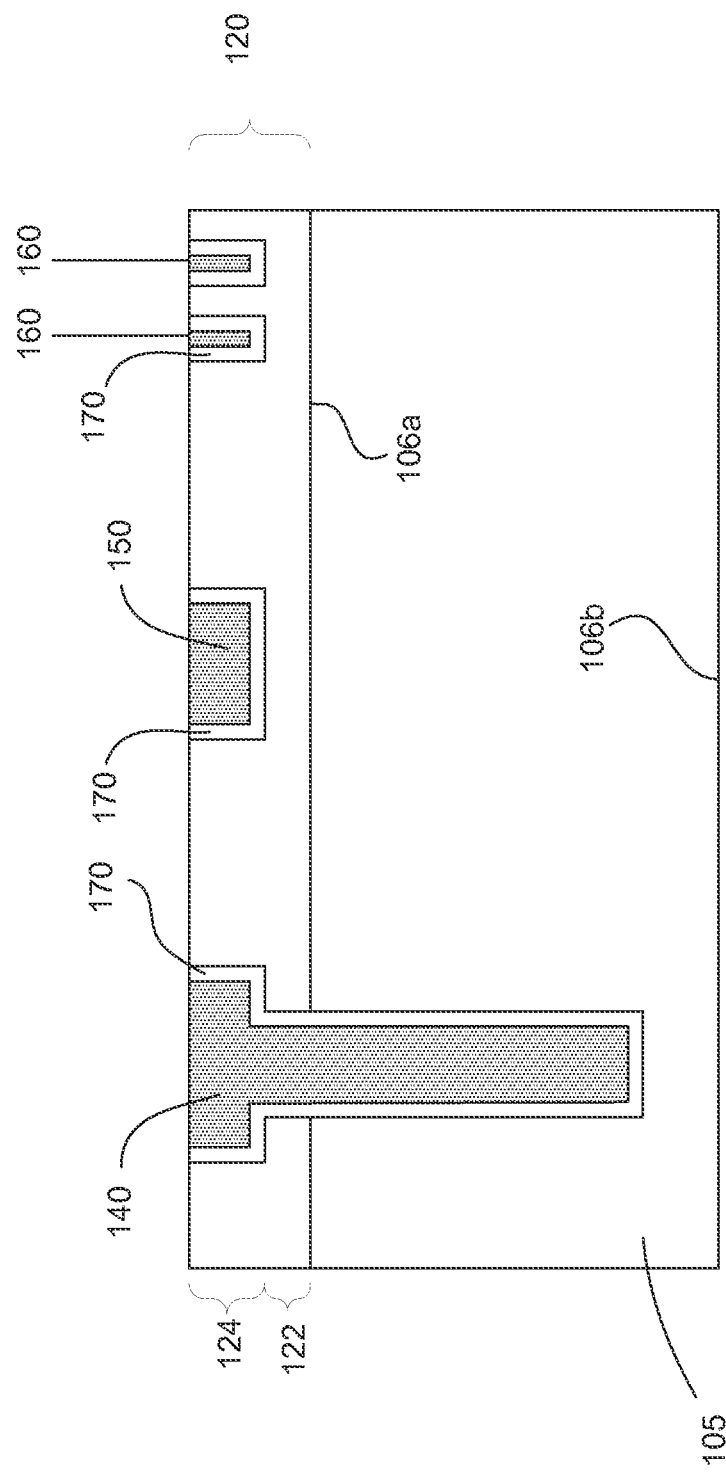

In FIG. 2g, a conductive layer 290 is formed on the substrate and fills the openings. The conductive layer, in one embodiment, is copper. The conductive layer may be formed by electroplating. As shown, the TV contact opening having the TV trench and TV opening is filled in a single step. Other suitable types of conductive material or deposition techniques may also be useful. Although the conductive layer has a planar top surface, it may have a topography (not shown). Excess conductive material is removed by, for example, CMP. The CMP forms a planar top surface between the dielectric layer, conductive layer and liner, as shown in FIG. 2h. The device formed, is the same as the device 100 as described in FIG. 1. The process, for example, continues to form a capping layer (not shown) over the top surfaces of the TSV contact and interconnect. The process may continue to complete the device, as discussed.

As described, conventional TV contacts require a zero alignment mark on the substrate. This adds to additional processing to form the zero alignment marks, thereby increasing cost as well as decreasing throughput. The embodiment as shown in FIGS. 2a-2h results in advantages. As presented with respect to FIGS. 2a-2h, no alignment marks are provided on the substrate. This eliminates the step of forming zero alignment marks on the substrate surface. The alignment mark openings, which are formed in scribe lanes in M1, serve to align the TV opening with the TV trench. Moreover, the TV opening etch aspect ratio is relatively lower than conventional dual damascene process since trenches have already been formed before forming the TV opening. Additionally, the TV contact opening having the TV trench and TV opening is filled with conductive material in a single step, greatly simplifying the overall process and reduces manufacturing costs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
   providing a substrate;
   forming a dielectric layer disposed on the substrate, the dielectric layer serves as an intermetal dielectric (IMD) layer which comprises an upper and lower portion, wherein the upper portion of the dielectric layer corresponds to a first metal level and the lower portion of the dielectric layer corresponds to a premetal dielectric (PMD) level;
   patterning the upper portion of the dielectric layer to form at least first and second trench openings and alignment mark openings, wherein one of the first and second trench openings serve as a through via (TV) trench while another trench opening serves as an interconnect trench, and wherein the PMD level separates the first and second trench openings and alignment mark openings in the first metal level from the substrate;
   forming a TV opening aligned to the TV trench, wherein the TV opening extends through the PMD level and partially into the substrate; and
   forming a conductive layer over the substrate to fill the trenches and the openings.

2. The method of claim 1 wherein the TV trench and the interconnect trench are formed simultaneously.

3. The method of claim 1 wherein the TV trench and the TV opening forms a TV contact opening.

4. The method of claim 1 wherein the alignment mark openings align the TV opening with the TV trench.

5. The method of claim 1 wherein the conductive layer fills the TV trench and TV opening in a single step.

6. The method of claim 1 wherein a top surface of the substrate surface is devoid of zero alignment marks.

7. The method of claim 1 comprising:
   forming an anti-reflective coating (ARC) layer on the dielectric layer, wherein the ARC layer fills the at least first and second trench openings and alignment mark openings; and
   forming a patterned mask layer on the ARC layer, the patterned mask layer is used to form the TV opening, wherein the TV trench and the TV opening forms a TV contact opening.

8. The method of claim 7 comprising:
   removing the ARC layer after the TV opening is formed, wherein removing the ARC layer exposes the trenches and the openings; and
   forming a liner layer on the substrate, wherein the liner layer lines the at least first and second trench openings, TV opening and the alignment mark openings, including the substrate walls.

9. The method of claim 1 comprising forming a liner layer lining the TV trench and the TV opening including the substrate walls, wherein the liner layer lines the TV trench and the TV opening in a single step.

10. The method of claim 9 wherein the liner layer comprises an isolation material and comprising forming a seed layer directly on and in contact with the liner layer.

11. The method of claim 1 wherein the substrate is a partially processed substrate.

12. The method of claim 11 wherein the TV opening comprises a depth which is greater than a final thickness of the substrate.

13. The method of claim 1 wherein bottom surfaces of the first and second trench openings and alignment mark openings are displaced away from a top surface of the substrate.

14. A method of forming a device comprising:
    providing a substrate;
    forming a dielectric layer disposed on the substrate, the dielectric layer comprises an upper and lower level;
    patterning the upper level of the dielectric layer to form at least first and second trench openings and alignment mark openings, wherein one of the first and second trench openings serves as a through via (TV) trench;
    forming an anti-reflective coating (ARC) layer on the substrate, wherein the ARC layer fills the at least first and second trench openings and alignment mark openings;
    forming a TV opening aligned to the TV trench, wherein the TV opening extends through the ARC layer and partially into the substrate;
    removing the ARC layer to expose the trenches and the openings; and
    forming a conductive layer over the substrate to fill the trenches and the openings.

15. The method of claim 14 wherein the at least first and second trench openings are interconnect trench openings and are formed simultaneously.

16. The method of claim 14 wherein the alignment mark openings align the TV opening with the TV trench.

17. The method of claim 14 wherein a top surface of the substrate surface is devoid of zero alignment marks.

18. The method of claim 14 comprising forming a liner layer lining the TV trench and the TV opening including the substrate walls, wherein the liner layer lines the TV trench and the TV opening in a single step.

19. A device comprising:
    a substrate, wherein the substrate comprises a surface which is devoid of zero alignment marks;
    a dielectric layer disposed on the substrate, the dielectric layer serves as an intermetal dielectric (IMD) layer which comprises an upper and lower portion, wherein the upper portion of the dielectric layer corresponds to a first metal level and the lower portion of the dielectric layer corresponds to a premetal dielectric (PMD) level, wherein the upper portion of the dielectric layer which corresponds to the first metal level comprises first and second trench openings and alignment mark openings, wherein one of the first and second trench openings serves as a through via (TV) trench, the PMD level separates the first and second trench openings and alignment mark openings in the first metal level from the substrate, and a TV opening aligned to the TV trench, wherein the TV opening extends through the PMD level and partially into the substrate; and a conductive layer fills the trenches and the openings.

20. The device of claim 19 comprising a liner layer lining the first and second trench openings, the TV opening, and the alignment mark openings including the substrate walls, wherein the liner layer is a continuous liner layer.

* * * * *